(12) United States Patent
Crane

(10) Patent No.: US 9,537,330 B2
(45) Date of Patent: Jan. 3, 2017

(54) SYSTEM AND METHOD FOR ELECTRICAL VEHICLE BATTERY MANAGEMENT

(75) Inventor: Jolyon M. Crane, Christchurch (GB)

(73) Assignee: Penny & Giles Controls Limited, Christchurch (GB)

( * ) Notice: Subject to any disclaimer, the term of this patent is extended or adjusted under 35 U.S.C. 154(b) by 440 days.

(21) Appl. No.: 13/057,550

(22) PCT Filed: Aug. 10, 2009

(86) PCT No.: PCT/GB2009/001959
§ 371 (c)(1),
(2), (4) Date: Feb. 4, 2011

(87) PCT Pub. No.: WO2010/015839
PCT Pub. Date: Feb. 11, 2010

(65) Prior Publication Data
US 2011/0133690 A1 Jun. 9, 2011

(30) Foreign Application Priority Data

Aug. 8, 2008 (GB) .................................. 0814523.7

(51) Int. Cl.
*H02J 7/00* (2006.01)
*G01N 27/416* (2006.01)
*G01R 31/36* (2006.01)
*B60L 11/18* (2006.01)
*H01M 10/44* (2006.01)

(52) U.S. Cl.
CPC .......... *H02J 7/0016* (2013.01); *B60L 11/1864* (2013.01); *G01R 31/361* (2013.01); *H01M 10/441* (2013.01); *H01M 10/443* (2013.01); *H02J 7/0057* (2013.01); *H02J 7/0068* (2013.01); *G01R 31/3606* (2013.01);
(Continued)

(58) Field of Classification Search
CPC ... H02J 7/0068; G01R 31/361; G01R 31/3606
USPC .................. 320/119, 107, 160; 324/427, 428
See application file for complete search history.

(56) References Cited

U.S. PATENT DOCUMENTS 3,895,284 A 7/1975 Schweizer et al.
4,194,146 A 3/1980 Lelaidier
(Continued)

FOREIGN PATENT DOCUMENTS

CN 1988314 A 6/2007
EP 0981194 A2 2/2000
(Continued)

*Primary Examiner* — Richard Isla Rodas
*Assistant Examiner* — David V Henze-Gongola
(74) *Attorney, Agent, or Firm* — Gordon & Jacobson, P.C.

(57) ABSTRACT

A powered system has a charging system and a controller arrangement. The charging system is capable of recharging the multi-cell power supply for the system and the controller arrangement enables selection between alternative modes of operation of the system. The charging system is arranged to operate in different regimes in which a target charging voltage across one or more cells or batteries is set to a different level dependent upon the selected mode of operation. There is provided a mode for optimizing the battery management for maximum range or, alternatively, a mode for extending charge and discharge cycle life of the multi-cell power supply. There is also a storage mode where the target voltage is set to a minimum value.

27 Claims, 1 Drawing Sheet

(52) U.S. Cl.
CPC ........ *Y02T 10/7005* (2013.01); *Y02T 10/7011* (2013.01); *Y02T 10/7061* (2013.01)

(56) References Cited

U.S. PATENT DOCUMENTS

| | | | |
|---|---|---|---|
| 4,390,828 A | 6/1983 | Converse et al. | |
| 4,968,941 A | 11/1990 | Rogers | |
| 5,644,212 A * | 7/1997 | Takahashi | 320/134 |
| 5,773,959 A | 6/1998 | Merritt et al. | |
| 6,060,864 A | 5/2000 | Ito et al. | |
| 6,140,801 A | 10/2000 | Aoki | |
| 6,229,285 B1 * | 5/2001 | Ding | 320/132 |
| 6,268,710 B1 | 7/2001 | Koga | |
| 6,377,024 B1 | 4/2002 | Choy | |
| 6,812,671 B2 * | 11/2004 | Formenti | H02J 7/0014 320/119 |
| 7,081,737 B2 * | 7/2006 | Liu | H01M 10/441 320/130 |
| 7,728,555 B2 * | 6/2010 | Seo et al. | 320/132 |
| 7,745,025 B2 * | 6/2010 | Leach et al. | 429/9 |
| 7,880,434 B2 * | 2/2011 | White et al. | 320/119 |
| 8,120,319 B2 * | 2/2012 | Nakatsuji | H02J 7/0016 320/115 |
| 2002/0084785 A1 | 7/2002 | Park | |
| 2003/0052647 A1 | 3/2003 | Yoshida et al. | |
| 2004/0016470 A1 | 1/2004 | Whitty | |
| 2004/0100225 A1 * | 5/2004 | Neil | B60L 1/003 320/109 |
| 2005/0168194 A1 | 8/2005 | Stanesti et al. | |
| 2007/0073455 A1 * | 3/2007 | Oyobe et al. | 701/22 |
| 2007/0139015 A1 * | 6/2007 | Seo et al. | 320/132 |
| 2008/0093851 A1 * | 4/2008 | Maeda et al. | 290/40 A |
| 2009/0115378 A1 * | 5/2009 | Ko | 322/25 |
| 2009/0146610 A1 * | 6/2009 | Trigiani | 320/119 |
| 2010/0106351 A1 * | 4/2010 | Hanssen | B60K 6/48 701/22 |

FOREIGN PATENT DOCUMENTS

| | | | |
|---|---|---|---|
| EP | 1367688 A1 | 3/2003 | |
| EP | 1801604 A2 | 6/2007 | |
| EP | 1837944 A2 | 9/2007 | |
| GB | 1237208 | 6/1971 | |
| GB | 2372645 A | 8/2002 | |
| GB | 2409591 A | 6/2005 | |
| GB | 244511 A | 6/2008 | |
| JP | WO 2008072650 A1 * | 6/2008 | ............ H02J 7/0016 |
| WO | WO 96/24979 | 8/1996 | |
| WO | WO 02/080332 A1 | 10/2002 | |
| WO | WO2006/072041 A2 | 7/2006 | |
| WO | WO 2006124130 A1 * | 11/2006 | ............ B60K 6/48 |
| WO | WO 2008072650 A1 * | 6/2008 | |

* cited by examiner

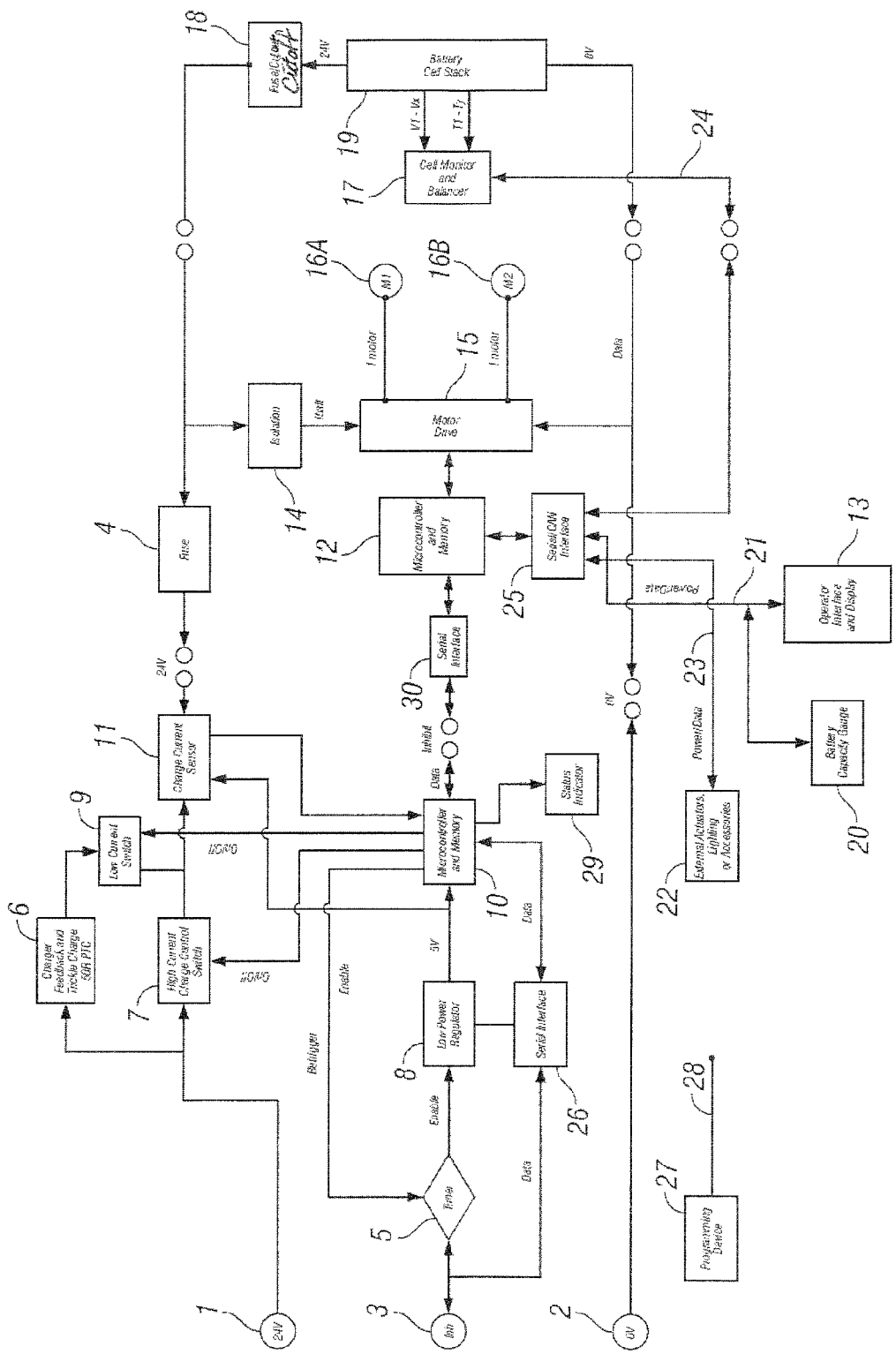

SYSTEM AND METHOD FOR ELECTRICAL VEHICLE BATTERY MANAGEMENT

BACKGROUND OF THE INVENTION

1. Field of the Invention

This invention relates generally to a battery management circuit, and more particularly, but not exclusively, to such a circuit capable of powering mobility vehicles.

2. State of the Art

Mobility vehicles, for instance medical mobility vehicles, which are currently on the market, typically use lead-acid batteries as their power source. Consequently the well established medical mobility vehicle industry uses system voltages, components and chargers that have been optimised to conform to this battery type.

Disadvantages with such systems are that the lead-acid batteries have a low energy to weight ratio compared to other types of battery that are available. It is desirable to make the battery as light as possible since in many instances the medical mobility vehicles, for instance wheelchairs and scooters, are designed to be dismantled and transported in motor vehicles to the place they will be used. There is therefore a trade off between the need to make the vehicle (consequently the battery) as light as possible and maximising the range over which the vehicle may be used.

Other battery types, for instance lithium-ion batteries, offer the potential for longer range and longer life cycles and are also lighter in weight, however they are not compatible with standard mobility vehicle components and chargers currently on the market. Further to this the nominal voltage delivered by a single lithium-ion polymer battery cell is 3.6 Volts and for a single lithium-ion phosphate cell 3.2V. Several lithium-ion battery cells would need to be stacked in series in order to provide sufficient voltage for many applications.

Rechargeable batteries are nearly all sensitive to the charging and discharging regime they experience over their operating lives. Lithium-ion cells are less sensitive to deep discharge cycles, however they have very strict maximum charging voltages and cells must be charged to their maximum voltage in order to maximise charge capacity. However, charging to a lower cell voltage and sacrificing some charge capacity enables the operating life of the cells to be significantly extended. This can be up to a factor of 2 or 4 times. Likewise, when lithium cells are discharged, there is a minimum allowable voltage across each cell and reducing the voltage beyond this limit can reduce the capacity and increase the cell self-discharge or leakage. By raising the minimum allowed cell voltage, the operating life of the cell or battery can be extended. This is especially the case where discharge currents are high.

In the case where the mobility vehicles are used very infrequently, the vehicle and battery may be stored for long periods. It is undesirable to store the battery with cell voltages at or near the maximum and minimum allowed values since the battery or individual cells will deteriorate and potentially lose charge storage capacity or exhibit increased self-discharge. Furthermore, storing cells with cell voltages at their maximum increases the risk of cell failure and fire.

SUMMARY OF THE INVENTION

It is therefore an object of the present invention to provide an improved mobility vehicle battery management circuit which alleviates the above mentioned problems and offers the versatility of powering a mobility vehicle over a longer range, or, alternatively increasing the life time of the battery, depending on the application desired.

In accordance with a first aspect of the present invention, there is provided a powered system including:
a charging system for a rechargeable multi-cell power supply for the powered system;
a controller arrangement enabling selection between alternative modes of operation of the system;
wherein the charging system is arranged to operate in different regimes in which a target charging voltage across one or more cells or batteries is set to a different level dependent upon the selected mode of operation of the powered system.

Beneficially, the target charging voltage corresponds to a maximum charging voltage.

Alternatively, the target charging voltage corresponds to a minimum discharge voltage.

Beneficially, dependent upon which alternative mode of operation that is selected, charging is controlled to ensure different parameter limits to be set, including one or both of:
maximum permitted cell charge;
minimum permitted cell charge;

It is preferred that the charging system includes a charge controller to switch the charging regime.

It is preferred that the powered system includes a monitor arrangement for monitoring the cell voltage and/or the temperature of the cells.

It is preferred that the controller arrangement includes a main system controller.

It is preferred that the charge controller is in communication with but discrete from the main system controller for the powered system. The powered system may be an electrically powered vehicle, or the like. The cell arrangement will typically be a rechargeable battery arrangement and aspects of the invention are particularly suited to use with lithium ion battery arrangements.

It is preferred that the cell voltage is monitored for the separate cells and the charging regime for the cells may be adjusted dependent upon cell voltage input from the monitor arrangement, such that separate cells may be subject to different charging regimes.

In certain embodiments, cell temperature may be monitored for the cells and the charging regime for the cells may be adjusted dependent upon cell temperature input from the monitor arrangement, such that separate cells may be subject to different charging regimes.

Beneficially, the charge controller is arranged to initiate a charge balancing function for the multi-cell power supply in response to the input from the monitoring arrangement.

It is preferred that, in the event of certain cells having a monitored voltage that is different (voltage mismatch) by a predetermined amount (voltage mismatch threshold) the charging regime is altered to reduce the voltage mismatch.

Beneficially, the charge balancing function may be implemented using a balancing arrangement which diverts charge away from certain cells until the voltage mismatch of the cells is reduced.

The charging controller is preferably in communication with (but discrete from) a main system controller for the powered system, and the main system controller receives charge state data from the charging controller and renders a charge state display for the user to review.

Desirably the charge controller monitors the amount of charge delivered to the multi-cell power supply. Preferably, the charge state of the multi-cell power supply is calculated by means of monitoring the number of coulombs delivered to the multi-cell power supply.

Beneficially, the charge state data concerning the amount of charge delivered to the multi-cell power supply is delivered to the main system controller for the powered system.

In one embodiment, the used charge data is calculated from current flow values from known parameters of the powered system. Additionally or alternatively, the used charge data is calculated from measured current flow values.

The delivered charge data may be calculated by means of monitoring the number of coulombs delivered to the multi-cell power supply.

According to a further aspect, the invention provides a powered system having a charging system for a rechargeable multi-cell power supply, the charging system comprising a charge controller discrete from the main control system of the powered system and enabling disconnection of the rechargeable multi-cell power supply from the main control system of the powered system when said power supply is to be charged.

Preferably, the arrangement includes charge balancing means for adjusting the distribution of charge within the separate cells in the power supply.

Preferably the system includes a circuit having a 3 terminal input port for connecting to a battery charger.

According to an alternative aspect, the invention provides a method of charging a rechargeable multi-cell power supply for a powered system, the method comprising:

selecting between alternative modes of operation of the powered system; and operating the charging system in different regimes in which the target voltage across one or more cells or batteries is set to a different level dependent upon the selected mode of operation of the powered system.

According to a further aspect, the invention provides a powered system including;

a charging system for a rechargeable multi-cell power supply for the powered system comprising:

a monitor arrangement for monitoring one or more parameters of separate cells; and a charge controller arranged to adjust the charging regime for the cells dependant upon input from the monitor arrangement, such that separate cells may be subject to different charging regimes;

a controller arrangement enabling rendering of information concerning the level of charge of the multi-cell power supply;

wherein, in charging the battery, the charging system monitors the amount of charge delivered to the multi-cell power supply and corresponding delivered charge data is directed to the controller, the level of charge information rendered being derived from the difference calculated between the delivered charge and used charge data calculated by and/or delivered to the controller.

According to an alternative aspect, the present invention provides a method of charging a rechargeable multi-cell power supply for a powered system and rendering of information concerning the level of charge of a multi-cell power supply for a powered system; the method comprising:

monitoring one or more parameters of separate cells;

adjusting the charging regime for the cells dependent upon input from the monitor arrangement, such that separate cells may be subject to different charging regimes;

monitoring the amount of charge delivered to the multi-cell power supply;

obtaining used charge data, calculating the difference between the delivered charge data and used charge data in order to enable rendering of the level of charge information.

In a further embodiment the present invention provides a charging system for a rechargeable multi-cell power supply for a powered system, the charging system comprising:

a monitor arrangement for monitoring one or more parameters of separate cells;

a charge controller arranged to adjust the charging regime for the cells dependent upon input from the monitor arrangement, such that separate cells may be subject to different charging regimes.

In an alternative embodiment, the invention provides a powered system including;

a charging system for a rechargeable multi-cell power supply for the powered system;

a controller arrangement enabling selection between alternative modes of operation of the system;

wherein the charging system is arranged to operate in different regimes dependent upon the selected mode of operation.

In a next embodiment, the invention provides a powered system including;

a charging system for a rechargeable multi-cell power supply for the powered system;

a controller arrangement enabling rendering of information concerning the level of charge of the multi-cell power supply;

wherein, in charging the battery, the charging system monitors the amount of charge delivered to the multi-cell power supply and corresponding delivered charge data is directed to the controller, the level of charge information rendered being derived from the difference calculated between the delivered charge and used charge data calculated by and/or delivered to the controller.

In a further embodiment, the invention provides a charging system for a rechargeable multi-cell power supply for a powered system, the charging system comprising a charge controller discrete from the main control system of the powered system and enabling disconnection of the rechargeable multi-cell power supply from the main control system of the powered system when said power supply is to be charged. The charging system includes a charge balancing means for adjusting the distribution of charge within the separate cells in the power supply. Alternatively, the charging system may be implemented in a powered system.

The invention extends further to a mobility vehicle, for instance a medical mobility vehicle, capable of implementing one or more aspects of the invention.

These and other aspects of the invention will be apparent from, and elucidated with reference to, the embodiment as described herein.

An embodiment of the present invention will now be described, by way of example only and with reference to the accompanying drawings.

FIG. 1 is a circuit diagram of the battery management circuit.

BRIEF DESCRIPTION OF THE DRAWINGS

In FIG. 1 there is shown a battery management system comprising a circuit having three main components; a vehicle control system, a battery charging system and a battery balancing system.

DETAILED DESCRIPTION OF THE PREFERRED EMBODIMENTS

A multi cell power supply, such as a battery cell stack 19, comprising a series of individual cells is connected to a standard vehicle control system. In this embodiment seven lithium-ion battery cells, such as lithium-polymer cells, are used. A fuse or cut out 18 is arranged in series to the battery, adjacent to the 24 V terminal. In operation the fuse protects the battery from external short circuits. The capacity of the cell stack 19 is optimised to 24 V, however this can be increased by using sets of parallel connected cells further connected in series.

The battery balancing system comprises a cell monitor and balancer circuit 17 connected to the individual cells of the battery 19. The cell monitor and balancer circuit 17 is further connected to at least one temperature sensing device that is placed in close thermal contact with at least one battery cell. A serial link 24 connects the cell monitor and balancer 17 to the charge microcontroller 10 which is used to monitor and control 17.

In operation the cell monitor and balancer 17 monitors the voltage and temperature of each cell. This data is passed to the microcontroller 10 via data link 24 which compares the values to pre-set upper and lower critical voltage limits. In the case that a cell is found to have a voltage approaching the upper or lower critical voltage, or where a cell has a comparatively high terminal voltage (voltage mismatch) that is different by a predetermined amount, the charge microcontroller 10 sends instructions to the monitor and balancer 17 to initiate the cell balancing function.

Once the cell balancing function is initiated, the charge is diverted from the cell via a discharge resistor until the balanced state is reached such that each of the cell voltages are approximately equal (for instance within 15 mV).

This cell balancing may be carried out in various ways and is dependent on system requirements, for example in the case that the battery capacity is very high, an active transfer circuit can be employed such that excess charge is moved to the other cells in the stack in a more efficient manner.

The integrity of the connections to the cells and temperature sensors are closely monitored by the cell monitor and balancer circuit 17. If a fault is detected then the charging or discharging of the battery cell stack is terminated. This is also the end result when multiple cells are found to approach the upper or lower voltage limits.

In operation, wherein the battery supplies power to the vehicle control system, the battery is connected to a main microcontroller 12 capable of connecting the motor drives to the battery 19 when desired. Further to this the main microcontroller 12 monitors and controls an operator interface and display 13 comprising a joystick or speed control and switches for controlling other peripheral devices such as external actuators, lighting or accessories 22. A battery capacity gauge 20 is also incorporated within the operator display and interface 13 and the two share a common serial data link 21.

System operation software and application settings are downloaded to the main microcontroller 12 at the manufacture stage. The software includes a wide range of advanced functions in addition to the basic vehicle driving functions. These advanced functions and settings are either enabled and configured during the control system manufacture or are enabled by means of a programming device 27, a PC interface (not shown) or the operator interface display.

The speed and other control commands from the operator display and interface 13 are communicated to the main controller 12 via a serial or CAN interface 25. The microcontroller reads the signal sent by the operator and generates the appropriate signals for the motor drive 15. The motor drive 15 then supplies suitable voltages to the motor. Further motors may be used depending on the application.

Under fault conditions, the microcontroller disconnects the battery 19 from the motor driver 15 by applying the circuit isolation means 14.

The battery charging system comprises a three pole 1, 2, 3 socket, where poles 1 and 2 provide connections to the nominally 24V external battery/charging supply. Pole 3 is used to signal to the charge control electronics 10 that the charger has been connected and is connected to a timer that is configured in series with a low power regulator, itself connected to the charge microcontroller 10. The charge microcontroller is further connected to a low current switch, a high current switch and a charge current sensor. A serial interface is also configured connecting pole 3, the charge microcontroller 10 and the main microcontroller 12.

Pole 1 of the charger interface is connected to a fuse 4 which is further connected to a high current charge control switch 7, which is controlled by charge microcontroller 10. A high current charge control switch 7 is connected to the charge current sensor and is also in series with the fuse or cutoff 18. A resistor 6 is included between the charger input terminal and the battery 19 via the charge current sensor 11, and is in series with a low current switch 9.

By connecting a standard lead-acid battery charger to poles 1, 2 and 3, pole 3 is grounded to pole 2 and a change of state is detected by the timer 5, which enables the low power regulator 8. The regulator consequently provides a power supply for the charge microcontroller 10 and charge current sensor 11. The charge microcontroller 10 is linked to the system microcontroller 12 and transfers the signal that the charger is connected to the charger interface causing the motor drive to be inhibited.

The charge current sensor has a restricted operating range of +/−15 Amps, although this may be varied as desired.

Once power is supplied to the charge microcontroller 10 it begins to carry out its various functions which are now summarised:

Setting the initial state of switches 7 and 9

Setting the initiation and control data formats for initialising and controlling cell monitor and balance 17

Setting the format of the data from cell monitor and balancer 17

Setting the maximum and minimum safe battery or cell voltages that constitute a fully charged or discharged condition Setting the maximum and minimum battery or cell voltages that enable an extended charge/discharge cycle life Setting the maximum allowed current through the charge current sensor 11

Setting the balancer control function requirements and charge balance current value Setting the charger specific protocol for controlling switches 7 and 9

Setting the protocols, when applicable, for communicating to a 'smart' charger via serial interface 26

The various parameters used to effect the summarised tasks are obtained from microcontroller 12.

When the battery charging system is in operation, the charge microcontroller 10 establishes communication with the cell monitor and balancer 17 so that the cell and battery voltages and temperatures can be read at a desired frequency (2 Hz). Once it is established that the cell voltages lie between a pre-programmed safe battery and cell voltage range, and the temperatures are established to be correct, the high charge current control switch 7 and the low current switch 9 are closed to initiate the flow of charging current into the battery 19. Switches 7 and 9 are preferably of the MOSFET (Metal Oxide Semiconductor Field Effect Transistor) type in order to ensure that the switch voltage drop and losses are low.

During this process, the charging current flows through the charge current sensor 11, which is preferably a Hall effect sensor based device such as the Allegro ACS712.

Charge Microcontroller 10 reads the current flowing through charge current sensor 11 and the amount of current is integrated in order to calculate the total number of coulombs that have flowed into the battery 19 since the last time the vehicle control system was switched on.

The number of coulombs that have flowed into the battery is stored in the memory of charge microcontroller 10. When the vehicle control system is switched on and the charger is disconnected, microcontroller 12 reads the number of coulombs stored in microcontroller 10 and uses the number to update the battery capacity gauge level calculation. The memory associated with the charge microcontroller 10 is reset to zero ready for the next charging cycle.

If during the charging cycle one or more cells show a higher than desired voltage compared to the others, then microcontroller 10 can instruct the cell monitor and balancer 17 to switch to the charge balancing function for the appropriate cells until a suitable charge balance is reached.

If the microconductor 10 detects that the current flowing either into or out of the battery 19 is too high then switches 7 and 9 are opened. A fault flag is stored in the microcontroller 10 and this is communicated to system controller 12 and a charging fault condition is indicated to the vehicle operator either by the operator interface and display 13 when the control system is switched on, or by a separate indicator 29, e.g. comprising a series of bicolour LEDS.

Fuse 4, located between the charge current sensor 11 and the branch of the circuit leading to the isolator 14, provides further protection in case of component failure permitting potentially damaging current flows.

When one or more of the cells approaches the maximum preset voltage across the terminals, indicating that the battery or cell charge is approaching the programmed maximum charged state, the switches 7 and 9 are controlled by the charge microcontroller 10. Switch 9 is opened while switch 7 is turned on and off intermittently at a low frequency. This ensures the cells are adequately balanced using a 'top-off' procedure.

The protocol of switches 7 and 9 may vary depending on the charger type connected to the system and are preset via the software, for instance, some lead-acid, or general purpose chargers may be rapidly connected and disconnected from the battery (typically a few hertz). Instead of pulsing the switch, the charging current could alternatively be tapered or cut back for a suitable period of time, before finally terminating.

The resistor 6, that is included between the charger input terminal and the battery 19 via the charge current sensor 11, provides a small current into the battery 19 in the event that switch 7 is open, and consequently prevents tripping or minimises the delay in providing current which is associated with some chargers. This also provides an additional 'top-off' or balancing means.

Whilst the charging, monitoring, balancing and coulomb counting processes are taking place, microcontroller 10 keeps the low power voltage regulator active by providing retrigger pulses to timer 5. If the charge process has been completed or the charger is disconnected, the microconductor 10 ceases to supply retrigger pulses to timer 5 and the recharge system can power down.

In the case where the vehicle control system is connected to a smart charger, microcontroller 10 may control the charging current and/or voltage via serial interface 26.

If the charger is still connected when the vehicle control system is switched on then the vehicle is prevented from moving and the condition is indicated to the operator.

When the vehicle control system is switched on and after initial system checks have been carried out, main microcontroller 12 determines the number of coulombs from the charge microcontroller 10 and resets the value to zero ready for the next charging cycle. Microcontroller 12 then requests the charge microcontroller 10 to establish communications with cell monitor and balancer 17 in order to obtain the voltage status and battery temperature. These quantities are then monitored by the microcontroller 12 at a predetermined frequency (2 Hz) via microcontroller 10, cell monitor 18 and serial link 24.

When the vehicle control system is switched on and the operator inputs the vehicle driving command, the microcontroller 12 closes the circuit isolator 14 connecting the motor drive 15. The motor is driven by the motor drive 15 under the command of microcontroller 12.

The speed and torque of the traction motors are controlled by Pulse Width Modulators (PWM) whereby the full battery voltage is applied to the motor for a short period of time at a fixed frequency (20 kHz). The motor speed and torque is adjusted by varying the ratio of the time the battery voltage is applied to the time the battery voltage is switched off.

For example, if the battery voltage is 24V and a switching frequency is 20 kHz and the period over which the battery voltage is applied to the motor is 10 µs and the period when the battery voltage is switched off is 40 µs then the PWM ratio is 20% and the effective driving voltage is 4.8V The battery current flowing when driving the fraction motor can be calculated by Ibatt=Imotor×PWM ratio. Calculating the current in this way prevents the need to use expensive high current sensors with a wide dynamic range.

In a further embodiment where multiple motors are present, then the total battery current is the sum of the resultant battery currents for each motor.

The vehicle is braked by making the at least one motor 16 act as a generator. In such cases energy is recovered by the motor drive 15, and subsequently generates a battery charging current. Microcontroller 12 is used to count the coulombs flowing out of (used charge) and into (delivered charge) the battery cell stack and together with the battery cell stack or cell temperature readings communicated via charge microcontroller 10, Cell monitor and balancer 17 and serial link 24 is able to continuously update the battery cell stack capacity gauge by calculating the difference between the delivered charge and the used charge.

At periodic intervals (typically 0.2 Hz) during motor drive and standby conditions, main microcontroller 12 obtains the actual cell and battery voltages via charge microcontroller 10, general data link 24 and cell monitor and balance 17. It is then able to ascertain a refined value of the battery capacity through pre-programmed calculations stored in main microcontroller 12.

The refined battery capacity is displayed via a gauge, but could be presented by any means able to communicate a proportion of the charge remaining, for example, via LCD display. Additionally, the calculated battery capacity is also displayed in ampere hours (Ah) wherein the battery temperature is compensated for. The number of shallow (e.g. 20% DOD) and deep (e.g. 80% DOD) cycles are also stored and displayed.

The external actuator, lighting or accessories 22 are connected via serial data and power cable 23. If these external functions are used only for a short period of time, then they use only a small amount of power. However, in instances where the power used by them is significant with regard to battery capacity, then the main microcontroller 12 will estimate the coulombs consumed and will adjust the battery capacity gauge accordingly. Alternatively, the accessory or function attached could feed current consumption data back to microcontroller 12 via the serial data and power cable 23 for incorporation into the battery capacity calculations.

The control system 12 and User Interface 13 offers the operator the option to optimise the battery management for maximum range or, alternatively, extending charge and discharge cycle life.

If the operator or application requires a long cycle life then this function is selected and the maximum charging voltage across each cell or battery is reduced and the minimum discharge voltage across each cell or battery is raised. The battery capacity gauge 20 is adjusted to display zero or empty when the lower allowable cell or battery voltage is reached and maximum or full when the maximum allowable cell or battery voltage is reached. In this instance, the battery capacity may be reduced by 20%.

If the operator or application requires the maximum duration of range, then this function is selected and the maximum charging voltage across each cell or battery is raised and the minimum discharge voltage across each cell or battery is reduced. The battery capacity gauge 20 is adjusted to display zero or empty when the lower allowable cell or battery voltage is reached and maximum or full when the maximum allowable cell or battery voltage is reached. Alternatively, a maximum permitted cell charge or minimum permitted call charge could be used to define the thresholds.

The battery storage and transportation function is initialised by selecting the function by means of the operator interface and display 13 or programming device 28. This then overrides the instruction to the operator to connect the battery charger as the battery is discharged and approaches the low charged state i.e. the lower allowable cell or battery voltage.

When the battery 19 has a higher charge than that required for storage, then the cell balancer is switched on providing a load across all the battery cells. The discharge rate may be increased by connecting a load dump device across the charger input terminals. This is particularly useful in instances where the cell balancer discharge current is small.

The load dump device consists of a resistor that draws an acceptable current from the charger socket whilst dissipating the heat generated. On initiation of the battery storage and transportation function, switches 7 and 9 are closed and the charging or discharging current is measured (or in the case of the balancer current a value is assumed). The total number of coulombs flowing into or out of the battery is calculated and stored by microcontroller 10.

While the battery storage and transportation process is activated the main control system is switched off or self shut down is effected in order to reduce the total system drain to as near zero as possible. During this time the status indicator and/or the operator interface and display show that the storage and transportation process is underway. Once the battery cells have reached the desired voltage level, microcontroller 10 opens switches 7 and 9 and timer 5 ceases to be retriggered so that voltage regulation 8 switches off. The whole system is powered down ready for the vehicle to be stored or dismounted for transport.

When the vehicle control system is next switched on, the microcontroller 12 reads the number of coulombs that have been stored in microcontroller 10 in order to update the battery capacity gauge level calculation and resets the stored value to zero ready for the next charging cycle. The vehicle operator is then instructed to fully recharge the batteries. This procedure limits significant capacity gauge errors after long periods of storage.

The microcontroller 12 is further programmed to interface to a range of batteries that have differing chemistries, storing capacities and temperature differences. The model parameters are preset for particular battery types enabling the selection of the appropriate type and the subsequent retrieval of relevant battery parameters by charge microcontroller 10 and main microcontroller 12. Programming device 27 also permits additional battery types and models to be downloaded if required and a custom battery function is available to allow individual battery and model parameters to be programmed (although this is restricted to manufacturers and distributers). The programming device 27 is capable of updating battery library models via a PC and an internet connection.

The main microcontroller 12 is programmed for optimum operating voltage and temperature ranges, and a capacity value expressed in ampere-hours (Ah) is programmed to provide a starting point for the battery capacity gauge calculations.

Following installation of a new battery, a full charging cycle is required in order to maximise initial battery gauge accuracy. Alternatively, the battery may be pre-charged externally to the vehicle in order that a full charge is available immediately. In this case, the operator will select a function that allows for a fully charged battery to be installed. In such instances, the ampere-hours capacity and the battery type (if a model is pre-stored) must be provided by the operator.

This could be developed further when a small number of batteries are used in rotation whereby a function stores the profile and therefore, the learned Ah capacity of the batteries and the battery in use can be selected so that a more accurate battery capacity gauge calculation and presentation may be made.

The battery gauge algorithm may utilise existing algorithms and may be based not only upon cell and overall battery voltages and temperatures, but also may be used in combination with impedances, by means of a Kalman filter cell or battery, so that an effective model of the battery may be continuously updated.

Where the system described is implemented in such a way as to be added onto an existing vehicle control topology, those skilled in the art would readily combine the elements within microcontrollers 10 and 12 into one single higher functionality microcontroller.

Advantages include that the battery management system allows for lithium-ion battery arrangements (or arrangements using other battery types with similarly desirable properties) to be used in mobility vehicles thereby offering a light weight power supply having a longer duration and prolonged cycle life. Further to this, the system offers the client versatility in terms of the vehicles application and components (e.g. battery type or accessories). The purchase cost has been minimised by eliminating the need for a high current meter, and the safety of the vehicle has been maintained by adding a battery storage and transportation function and a cell balancing function. The battery management circuit further enables the lithium-ion battery arrangement (or arrangement using other battery types with similarly desirable properties) to be charged by means of standard chargers in the industry which minimises the cost of maintaining the mobility vehicles.

It should be noted that the above-mentioned embodiment illustrates rather than limits the invention, and that those skilled in the art will be capable of designing many alternative embodiments without departing from the scope of the invention as defined by the appended claims. In the claims, any reference signs placed in parentheses shall not be construed as limiting the claims. The word "comprising" and "comprises", and the like, does not exclude the presence of elements or steps other than those listed in any claim or the specification as a whole. The singular reference of an element does not exclude the plural reference of such elements and vice-versa. In a device claim enumerating several means, several of these means may be embodied by one and the same item of hardware. The mere fact that certain measures are recited in mutually different dependent claims does not indicate that a combination of these measures cannot be used to advantage.

The invention claimed is:

1. A control system for use with an electrically powered vehicle having a rechargeable multi-cell power supply including a plurality of rechargeable power cells as well as motor drive circuitry that is selectively activated to drive at least one motor/generator, the control system including:
   a vehicle controller that is in communication with but discrete from a charge controller, wherein the vehicle controller and the charge controller have a first configuration different from a second configuration;
   wherein, in the first configuration, the motor drive circuitry is decoupled from the rechargeable multi-cell power supply and the charge controller couples an external power supply to the rechargeable multi-cell power supply and charges the rechargeable power cells of the power supply by i) switching amongst different regimes in which a target charging voltage across one or more of the rechargeable power cells is set to different levels, and ii) calculating first data representative of the amount of charge delivered to the power supply in the first configuration; and
   wherein, in the second configuration, the motor drive circuitry is coupled to the rechargeable multi-cell power supply and the vehicle controller controls the motor drive circuitry for driving the at least one motor/generator in response to operator input whereby the at least one motor/generator uses current supplied by the rechargeable multi-cell power supply or generates charging current for supply to the rechargeable multi-cell power supply, and the vehicle controller calculates and renders information concerning level of charge of the power supply based on the first data calculated in the first configuration, and the vehicle controller calculates a difference between second data representative of the charge drawn from the power supply in the second configuration and third data representative of the amount of charge delivered to the power supply in the second configuration and then subsequently uses the difference between the second and third data to update and render the information concerning level of charge of the power supply.

2. A control system according to claim 1, wherein:
   the target charging voltage corresponds to a maximum charging voltage.

3. A control system according to claim 1, wherein:
   the target charging voltage corresponds to a minimum discharge voltage.

4. A control system according to claim 1, wherein:
   the charge controller is arranged such that charging of the rechargeable power cells of the power supply is controlled by setting parameter limits selected from the group including maximum permitted cell charge and minimum permitted cell charge.

5. A control system according to claim 1, further comprising:
   a monitor arrangement to monitor a parameter of one or more of the rechargeable power cells, said parameter selected from the group including the cell voltage and cell temperature.

6. A control system according to claim 1, further comprising:
   a monitor arrangement that monitors cell voltages for respective rechargeable power cells, and the charge controller is adapted to adjust the charging regime for the respective rechargeable power cells in response to the corresponding cell voltages input from the monitor arrangement, such that separate rechargeable power cells may be subject to different charging regimes.

7. A control system according to claim 1, further comprising:
   a monitor arrangement that monitors cell temperatures for respective rechargeable power cells, and the charge controller is adapted to adjust the charging regime for the respective rechargeable power cells in response to the corresponding cell temperatures input from the monitor arrangement, such that separate rechargeable power cells may be subject to different charging regimes.

8. A control system according to claim 1, further comprising:
   a monitor arrangement, wherein the charge controller is arranged to initiate a charge balancing function for the rechargeable power cells of the power supply in response to the input from the monitoring arrangement.

9. A control system according to claim 8, wherein:
   said monitor arrangement monitors voltages for respective rechargeable power cells of the power supply; and
   said charge controller is adapted to determine if the voltages for certain rechargeable power cells of the power supply are different by a predetermined amount and initiate the charge balancing function in response thereto, whereby the charge balancing function alters the charging regime to reduce differences between such voltages.

10. A control system according to claim 9, wherein:
    the charge balancing function is implemented using a balancing arrangement which diverts charge away from certain rechargeable power cells until the differences between such voltages is reduced.

11. A control system according to claim 1, wherein:
    the vehicle controller renders a charge state display for the user to review.

12. A control system according to claim 1, wherein:
    the charge controller enables disconnection of the rechargeable power cells of the power supply from the vehicle controller when the rechargeable power cells of the power supply is to be charged.

13. A control system according to claim 12, further comprising:
    charge balancing means for adjusting the distribution of charge within the separate rechargeable power cells of the power supply.

14. A control system according to claim 1, further comprising:
a circuit having a 3 terminal input port.

15. A control system according to claim 1, wherein:
the rechargeable power cells of the power supply are lithium ion batteries.

16. A control system according to claim 1, wherein:
the second data is calculated from current values derived from operating parameters.

17. A control system according to claim 1, wherein:
the second data is calculated from measured current values.

18. A control system according to claim 1, wherein:
the first data is calculated by means of monitoring the number of coulombs delivered to the rechargeable power cells of the power supply.

19. A control system according to claim 1, further comprising:
a monitoring arrangement that monitors cell voltage for the respective rechargeable power cells of the power supply;
wherein the charge controller is adapted to adjust the charging regime for the respective rechargeable power cells of the power supply in response to corresponding cell voltages input from the monitor arrangement, such that separate rechargeable power cells are subject to different charging regimes.

20. A control system according to claim 1, further comprising:
a monitoring arrangement that monitors cell temperature for the respective rechargeable power cells of the power supply;
wherein the charge controller is adapted to adjust the charging regime for the respective rechargeable power cells of the power supply in response to corresponding cell temperatures input from the monitor arrangement, such that separate rechargeable power cells are subject to different charging regimes.

21. A control system according to claim 1, wherein:
the charge controller is arranged to initiate a charge balancing function for the rechargeable power cells of the power supply in response to the input from a monitoring arrangement that monitors for the respective rechargeable power cells of the power supply.

22. A control system according to claim 21, wherein:
said monitor arrangement monitors voltages for respective rechargeable power cells of the power supply; and
said charge controller is adapted to determine if the voltages for certain rechargeable power cells of the power supply are different by a predetermined amount and initiate the charge balancing function in response thereto, whereby the charge balancing function alters the charging regime to reduce differences between such voltages.

23. A control system according to claim 22, wherein:
the charge balancing function is implemented using a balancing arrangement which diverts charge away from certain rechargeable power cells until the differences between such voltages is reduced.

24. An electrically powered vehicle device, comprising:
a rechargeable multi-cell power supply including a plurality of rechargeable power cells; and
the control system of claim 1.

25. A control system according to claim 1, wherein:
the vehicle controller is switched ON in the second configuration.

26. A control system according to claim 1, wherein:
an operator inputs a vehicle drive command in the second configuration.

27. A method of charging a rechargeable multi-cell power supply of an electrically powered vehicle having motor drive circuitry that is selectively activated to drive at least one motor/generator, wherein the rechargeable multi-cell power supply includes a plurality of rechargeable power cells, the method comprising:
providing a vehicle controller that is in communication with but discrete from a charge controller;
operating the vehicle controller and the charge controller in a first configuration wherein the motor drive circuitry is decoupled from the rechargeable multi-cell power supply and the charge controller couples an external power supply to the rechargeable multi-cell power supply and charges the rechargeable power cells of the power supply by i) switching amongst different regimes in which a target charging voltage across one or more of the rechargeable power cells is set to different levels, and ii) calculating first data representative of the amount of charge delivered to the power supply in the first configuration; and
operating the vehicle controller and the charge controller in a second configuration different from the first configuration, wherein, in the second configuration, the motor drive circuitry is coupled to the rechargeable multi-cell power supply and the vehicle controller controls the motor drive circuitry for driving the at least one motor/generator in response to operator input whereby the at least one motor/generator uses current supplied by the rechargeable multi-cell power supply or generates charging current for supply to the rechargeable multi-cell power supply, and the vehicle controller calculates and renders information concerning level of charge of the power supply based on the first data calculated in the first configuration, and the vehicle controller calculates a difference between second data representative of the charge drawn from the power supply in the second configuration and third data representative of the amount of charge delivered to the power supply in the second configuration and then subsequently uses the difference between the second and third data to update and render the information concerning level of charge of the power supply.

* * * * *